(12) United States Patent
Shiraishi

(10) Patent No.: US 6,833,223 B2
(45) Date of Patent: Dec. 21, 2004

(54) MULTILAYER-FILM REFLECTIVE MIRRORS AND OPTICAL SYSTEMS COMPRISING SAME

(75) Inventor: Masayuki Shiraishi, Machida (JP)

(73) Assignee: Nikon Corporation, Tokyo (JP)

( * ) Notice: Subject to any disclaimer, the term of this patent is extended or adjusted under 35 U.S.C. 154(b) by 59 days.

(21) Appl. No.: 10/161,118

(22) Filed: May 31, 2002

(65) Prior Publication Data
US 2003/0222225 A1 Dec. 4, 2003

(51) Int. Cl.⁷ .............................. G03F 9/00; F21V 9/04; G02B 5/08
(52) U.S. Cl. ............................................ 430/5; 359/359
(58) Field of Search .............................. 430/5; 359/359, 359/584; 378/34, 35

(56) References Cited

FOREIGN PATENT DOCUMENTS

| JP | 02217801 | 8/1990 |
| JP | 04169898 | 6/1992 |

OTHER PUBLICATIONS

U.S. patent application Ser. No. 10/012,739, Shiraishi et al., filed Oct. 19, 2001.
U.S. patent application Ser. No. 10/196,528, Shiraishi, filed Jul. 15, 2002.
Singh et al., "Design of multilayer extreme–ultraviolet mirrors for enhanced reflectivity." *Applied Optics*, vol. 39, No. 13, pp. 2189–2197, May 1, 2000.
European Search Report, dated Nov. 7, 2002, for corresponding EP application No. EP2012085.

*Primary Examiner*—S. Rosasco
(74) *Attorney, Agent, or Firm*—Klarquist Sparkman, LLP

(57) ABSTRACT

Multilayer-film mirrors are disclosed that exhibit high reflectivity to incident X-radiation independently of the angle of incidence and without significantly compromising optical performance. Also disclosed are X-ray optical systems and microlithography apparatus comprising such mirrors. In an embodiment a multilayer-film mirror is formed by alternately laminating Mo layers (a material in which the difference between its refractive index in the weak X-ray band and its refractive index in a vacuum is great) and Si layers (a material in which said difference is small) on a substrate. The ratio ($\Gamma$) of the thickness of the Mo layer to the total of the thickness of the Mo layer and the thickness of the Si layer has a distribution based on the distribution of angles of incidence of X-radiation on the mirror surface. By providing $\Gamma$ with a distribution that corresponds with the distribution of the angles of incidence in the mirror surface, maximum reflectivity can be obtained at the angles of incidence at various points within the mirror surface. Because there is no need to change the period length in this case, there is no deterioration in the optical performance of the mirror.

29 Claims, 5 Drawing Sheets

MULTILAYER-FILM REFLECTIVE MIRRORS AND OPTICAL SYSTEMS COMPRISING SAME

FIELD

This disclosure pertains to reflective elements (reflective mirrors) that are especially suitable for use in "X-ray" optical systems. By "X-ray" is meant not only the conventional "hard" X-ray wavelengths of the electromagnetic spectrum but also the so-called "soft X-ray" (also termed "extreme ultraviolet" or EUV) wavelengths. More specifically, the disclosure pertains to multilayer-film-coated mirrors that can be used in any of various X-ray optical systems such as X-ray microscopes, X-ray analysis equipment, and X-ray exposure (microlithography) apparatus.

BACKGROUND

As the density of active-circuit elements in microelectronic devices (e.g., integrated circuits, displays, and the like) has continued to increase with corresponding decreases in the size of active-circuit elements in such devices, the resolution limitations of optical microlithography have become apparent. To obtain better resolution of circuit elements, especially such elements having a width of 0.15 micrometer or less, increasing attention has been directed to the development of a practical "next generation" microlithography technology.

A key candidate for next-generation microlithography exploits the short wavelengths of X-ray radiation. For example, EUV radiation is in the wavelength range of 11 to 14 nm, which is substantially shorter than the 157-nm wavelength representing the shortest achievable wavelength used in the deep UV radiation used in conventional optical microlithography. These shorter wavelengths in the X-ray portion of the electromagnetic spectrum offer tantalizing prospects of substantially improved pattern-element resolution (e.g., 70 nm or less) in microlithography. See, e.g., Tichenor et al., *Transactions SPIE* 2437:292 (1995).

The complex refractive index "n" of substances in the wavelength range of X-rays is expressed as $n=1-\delta-ik$ (wherein $\delta$ and k are complex numbers). The imaginary part k of the refractive index expresses X-ray absorption. Since $\delta$ and k are both considerably less than 1, the refractive index in this wavelength range is extremely close to 1. Consequently, optical elements such as conventional lenses cannot be used. Reflective optical elements, on the other hand, are practical and currently are the subject of substantial research and development effort.

From most surfaces, X-rays exhibit useful reflection only at oblique angles of incidence. In other words, the reflectivity of X-rays is extremely low at angles of incidence less than the critical angle $\theta_c$ of total reflection, which is about 20° at a wavelength of 10 nm. Angles greater than $\theta_c$ exhibit total reflection. Hence, many conventional X-ray optical systems are so-called "oblique-incidence" systems in which the X-radiation is incident at angles greater than $\theta_c$ to the reflective surfaces in the optical systems. (The angle of incidence is the angle formed by the propagation axis of an incident beam relative to a line normal to the surface at which the propagation axis is incident.)

It has been found that multilayer-film mirrors exhibit high (albeit not total) reflectivity to X-radiation. The multilayer coating typically comprises several tens to several hundreds of layers. The layers are of materials exhibiting the highest available boundary-amplitude reflectivity. The thickness of each layer is established based on light-interference theory so as to achieve alignment of the phases of light waves reflected from the various layers. Multilayer-film mirrors are formed by alternately laminating, on a suitable substrate, a first substance of which the difference between its refractive index in the X-ray wavelength band to be used and its refractive index (n=1) in a vacuum is relatively large and a second substance of which this difference is relatively small. Conventional materials satisfying these criteria and exhibiting good performance are tungsten/carbon and molybdenum/carbon composites. These layers are usually formed by thin-film-formation techniques such as sputtering, vacuum deposition, CVD, etc.

Since multilayer-film mirrors also are capable of reflecting X-radiation at low angles of incidence (including perpendicularly incident X-radiation), these mirrors can be incorporated into X-ray optical systems exhibiting lower aberrations than exhibited by conventional oblique-incidence X-ray optical systems.

A multilayer-film mirror exhibits a wavelength dependency in which strong reflection of incident X-radiation is observed whenever Bragg's equation is satisfied. Bragg's equation is expressed as $2d \sin(\theta')=n\lambda$, wherein d is the period length of the multilayer coating, $\theta'$ is the angle of incidence measured from the incidence plane (i.e., $\pi/2-\theta$), and $\lambda$ is the X-ray wavelength. Under conditions satisfying Bragg's equation, the phases of the reflected waves are aligned with each other, thereby enhancing reflectivity of the surface. For maximal reflectivity, the variables in the equation are selected so that the equation is fulfilled.

Whenever the multilayer coating of an X-ray mirror comprises alternating layers of molybdenum (Mo) and silicon (Si), the mirror exhibits high reflectivity at the long-wavelength side of the L-absorption end of silicon (i.e., at 12.6 nm). Thus, a multilayer-film mirror exhibiting high reflectivity (over 60% at direct incidence, $\theta=0°$) at $\lambda \approx 13$ nm can be prepared with relative ease. As a result, Mo/Si multilayer-film mirrors are the currently most promising mirror configuration for use in reduction/projection microlithography performed using soft X-ray (EUV) radiation. This type of microlithography is termed extreme ultraviolet lithography (EUVL).

Whereas Mo/Si multilayer-film mirrors exhibit high reflectivity, as discussed above, their performance depends upon the wavelength of incident radiation and upon the angle of incidence, as indicated by Bragg's equation. Especially with curved multilayer-film-coated mirror surfaces, the angle of incidence of an X-ray beam differs at various points on the surface of such a mirror used in an illumination-optical system or a projection-optical system of an EUVL system. The difference in incidence angle over the mirror surface can range from several degrees to several tens of degrees. Consequently, whenever a multilayer film is formed with a uniform thickness over the entire surface of the mirror substrate, differences in reflectivity at the mirror surface will be evident as a result of the differences in the angle of incidence.

FIG. 6 is a graph showing a theoretical relationship of reflectivity to the angle of incidence of a multilayer-film mirror having a period length of 69 Å, a lamina count of 50 layer pairs, and an incident-light wavelength of 13.36 nm. The abscissa is angle of incidence and the ordinate is reflectivity. The solid-line curve denotes reflectivity of s-polarized light and the dotted line denotes reflectivity of non-polarized light. The period length is the total thickness of one pair of layers (i.e., in the case of a Mo/Si multilayer coating, one Mo layer with its adjacent Si layer). The ratio of the thickness of a single Mo layer to the period length is denoted $\Gamma$; in this example $\Gamma$ is constant at 0.35. As can be seen from FIG. 6, reflectivity changes with the angle of incidence. Reflectivity is nearly 74% at a 0° angle of incidence, and decreases to less than 60% at a 110° angle of incidence. This represents a greater than 10% drop in reflectivity.

A conventional countermeasure to the reflectivity drop noted above involves providing the thickness of the multilayer coating with a distribution that changes over the mirror surface in a manner serving to offset the change in reflectivity. Thus, light of a specified wavelength is reflected with high reflectivity at the various angles of incidence characteristic of various respective points on the reflective surface.

For example, FIG. 7 is a graph showing the relationship of the period length and of total film thickness (period length×number of layer pairs) at which reflectivity is highest for an incident $\lambda$=13.36 nm versus the angle of incidence. The abscissa is angle of incidence, the left-hand ordinate is period length, and the right-hand ordinate is total film thickness ($\Gamma$=0.35). As can be seen in FIG. 7, the period length and total film thickness at which reflectivity is highest are approximately 68.28 Å and 3413 Å (50 layer pairs), respectively, whenever the angle of incidence is 0°. Whenever the angle of incidence is 10°, the period length and total film thickness at which reflectivity is highest are approximately 69.31 Å and 3466 Å (50 layer pairs), respectively. Consequently, in order for reflectivity to be at its highest at the various angles of incidence, it is necessary to make the period length approximately 1 Å larger, at points at which the angle of incidence is about 10°, than at points at which the angle of incidence is about 0°. Now, Mo/Si multilayer coatings on EUV-reflective multilayer-film mirrors generally comprise 50 layer pairs. Locally increasing the period length on a multilayer coating as summarized above would create a difference of 4.7 nm in the total film thickness of the multilayer coating, which would impose a corresponding change in the surface profile of the multilayer-film mirror. Since the magnitude of this change exceeds what can be tolerated from the standpoint of wavefront aberration of light reflected from the mirror, such changes can significantly deteriorate the optical performance of an EUV optical system including such a mirror.

SUMMARY

In view of the shortcomings of conventional multilayer-film mirrors as summarized above, the present invention provides, inter alia, multilayer-film mirrors that exhibit high reflectivity to incident X-radiation, independently of the angle of incidence and without deteriorating optical performance of the mirror. The invention also provides X-ray optical systems including such multilayer-film mirrors.

According to a first aspect of the invention, multilayer-film mirrors are provided that comprise a mirror substrate and a multilayer film on a surface of the mirror substrate. An embodiment of the multilayer film is configured so as to render the surface reflective to one or more selected wavelengths of incident X-ray light (e.g., hard X-ray light or "soft" X-ray light such as extreme ultraviolet (EUV) light). The multilayer film is formed of alternating superposed layers of a first and a second material arranged as multiple layer pairs superposed on the surface. The first material has a relatively large difference between its refractive index for X-ray light and its refractive index in a vacuum, and the second material has a relatively small difference between its refractive index for X-ray light and its refractive index in a vacuum. Each layer of the first material in the multilayer film has a respective thickness. In at least one of the layer pairs, a ratio ($\Gamma$) of the thickness of the respective layer of the first material to a thickness of the layer pair has a variable distribution over at least a portion of the surface.

In the multilayer-film mirror summarized above, $\Gamma$ can vary with changes in angle of incidence of incident radiation over at least a portion of the surface. By varying $\Gamma$ in this manner, maximal reflectivity can be obtained at each point on the reflective surface, corresponding to the respective angle of incidence at each point. For example, $\Gamma$ can decrease with corresponding increases in angle of incidence of incident radiation over at least a portion of the surface. Generally, the angle of incidence is greater at the perimeter of a mirror than at the center of the mirror. Hence, by decreasing F at regions where the angle of incidence is great, high reflectivity can be achieved at such regions as well as at, for example, the center of the mirror.

By way of example, the first material can comprise molybdenum, which is especially suitable for a multilayer-film mirror reflective to incident EUV light. For certain wavelengths of EUV light, the first material can include ruthenium. Also for EUV light, the second material can comprise silicon.

In another embodiment the distribution of $\Gamma$ is stepped over at least a portion of the surface. In this configuration, each step corresponds to a respective range of angle of incidence of radiation incident to the surface.

In another embodiment the distribution of $\Gamma$ is continuous over at least a portion of the surface. In this distribution, $\Gamma$ varies with respective angles of incidence of radiation incident to the surface. Typically, the layer pairs have a period length. The distribution of $\Gamma$ can be continuous over a first portion of the surface in which angle of incidence of light incident to the surface is within a respective range and the period length is constant. In a second portion of the surface outside the first portion, $\Gamma$ can be constant while the period length is increased. Alternatively, the distribution of $\Gamma$ can be continuous over the surface, wherein the period length changes continuously over the surface.

According to another aspect of the invention, optical systems are provided that comprise any of the various embodiments of multilayer-film mirrors such as those summarized above. The optical systems can be configured as, for example, X-ray optical systems such as EUV optical systems.

According to yet another aspect of the invention, optical elements are provided that are reflective to incident X-ray light. An embodiment of such an optical element comprises a mirror substrate and a multilayer film on a surface of the mirror substrate. The multilayer film is configured as summarized above. The optical element can be, for example, a multilayer-film mirror or a reflective reticle. One or more such optical elements can be incorporated into, for example, an X-ray optical system such as an X-ray lithography tool.

According to yet another aspect of the invention, methods are provided for producing a multilayer-film mirror. In an embodiment of such a method, a surface of a mirror substrate is configured to be a reflective surface. On the reflective surface, a multilayer-film coating is formed by applying alternating superposed layers of a first and a second material arranged as multiple layer pairs superposed on the reflective surface. The first material has a relatively large difference between its refractive index for X-ray light and its refractive index in a vacuum, and the second material having a relatively small difference between its refractive index for X-ray light and its refractive index in a vacuum. Each layer of the first material in the multilayer film has a respective thickness. In at least one of the layer pairs, a ratio (Γ) of the thickness of the respective layer of the first material to a thickness of the layer pair has a variable distribution over at least a portion of the surface.

The multilayer-film coating can be formed such that Γ varies with changes in angle of incidence of incident radiation over at least a portion of the surface. Alternatively, the multilayer-film coating can be formed such that Γ decreases with corresponding increases in angle of incidence of incident radiation over at least a portion of the surface. Further alternatively, the multilayer-film coating can be formed such that the distribution of Γ is stepped over at least a portion of the surface, wherein each step corresponds to a respective range of angle of incidence of radiation incident to the surface. Yet further alternatively, the multilayer-film coating can be formed such that the distribution of Γ is continuous over at least a portion of the surface, wherein, in the distribution, Γ varies with respective angles of incidence of radiation incident to the surface.

Typically, the multilayer-film coating is formed such that the layer pairs have a period length. The distribution of Γ can be continuous over a first portion of the surface in which angle of incidence of light incident to the surface is within a respective range and the period length is constant. In a second portion of the surface outside the first portion, Γ can be constant while the period length is increased. Alternatively, the distribution of Γ can be continuous over the surface, wherein the period length changes continuously over the surface.

According to yet another aspect of the invention, X-ray lithography tools are provided that comprise an X-ray light source, and illumination-optical system, and a projection-optical system. The X-ray light source is situated and configured to produce an X-ray illumination beam. The illumination-optical system is situated downstream of the X-ray light source and is configured to guide the illumination beam to a reticle, so as to form a patterned beam of X-ray light reflected from the reticle. The projection-optical system is situated downstream of the reticle and is configured to guide the patterned beam from the reticle to a sensitive substrate. At least one of the illumination-optical system, the reticle, and the projection-optical system comprises a multilayer-film mirror. The multilayer-film mirror comprises a multilayer film on a surface of a mirror substrate. The multilayer film is configured so as to render the surface reflective to one or more selected wavelengths of incident X-ray light. The multilayer film is formed of alternating superposed layers of a first and a second material arranged as multiple layer pairs superposed on the surface, the first material has a relatively large difference between its refractive index for soft-X-ray light and its refractive index in a vacuum. The second material has a relatively small difference between its refractive index for soft-X-ray light and its refractive index in a vacuum. Each layer of the first material in the multilayer film has a respective thickness, and, in at least one of the layer pairs, the ratio (Γ) of the thickness of the respective layer of the first material to a thickness of the layer pair has a variable distribution over at least a portion of the surface.

The foregoing and additional features and advantages of the invention will be apparent from the following detailed description, which proceeds with reference to the accompanying drawings.

DETAILED DESCRIPTION

Whenever the period length of a multilayer-flim-coated minor is changed in accordance with Bragg's equation, described above, the wavelength at which the reflectivity of the mirror is highest also changes. On the other hand, due to differences in the refractive indices of materials constituting the multilayer coating, the wavelength at which the mirror exhibits maximal reflectivity changes with corresponding changes in Γ, even while keeping the period length constant.

Figure 7:
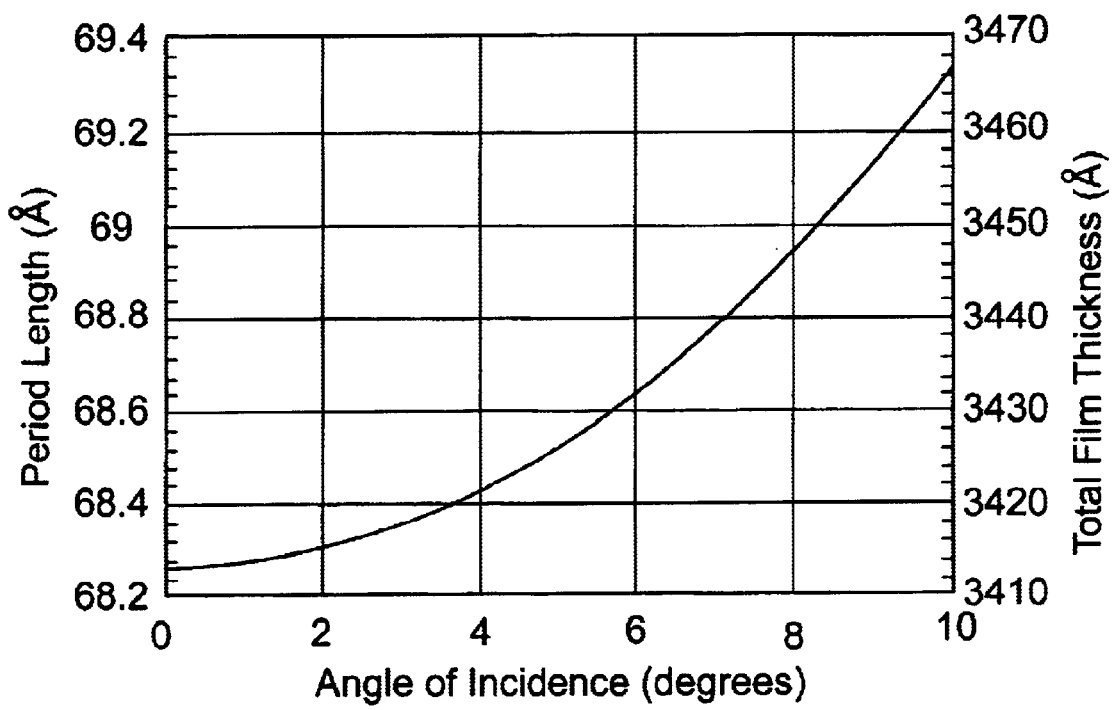
FIG. 7 is a graph showing the relationship of the period length and of total thickness of the multilayer film (period length×number of layer pairs) at which reflectivity is highest for an incident λ=13.36 nm versus the angle of incidence.
Figure 8:
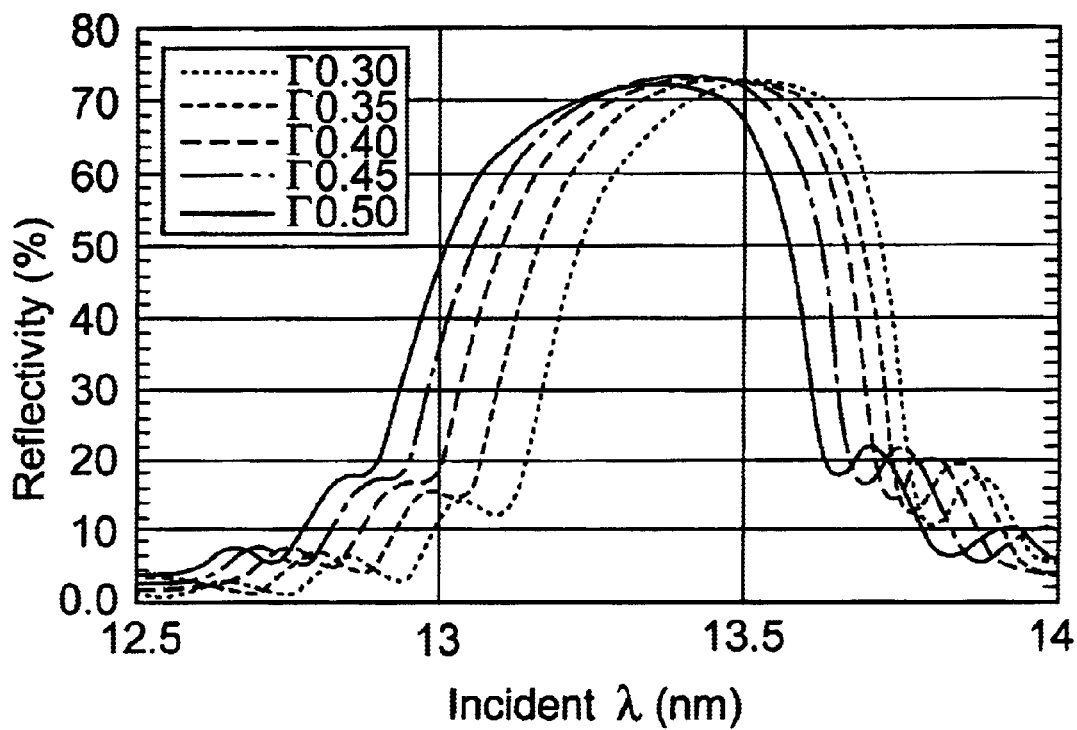
FIG. 8 shows curves exhibiting the relationship between incident wavelength and reflectivity of a multilayer-film mirror.

An exemplary relationship between incident wavelength and reflectivity is depicted in FIG. 8. This graph shows the reflectivity, of light incident at 0° angle of incidence, of a Mo/Si multilayer coating having a period length of 69 Å. The abscissa is wavelength of incident light, and the ordinate is reflectivity. The various curves depict respective results observed as Γ is changed from 0.30 to 0.50 in increments of 0.05. As can be seen in FIG. 8, the wavelength of maximal reflectivity changes as Γ is changed, while keeping the period length constant. In other words, whenever Γ=0.50, a peak reflectivity of approximately 72% is observed at λ≈13.4 nm. Whenever Γ=0.30, a peak reflectivity of approximately 72% is observed at λ≈13.6 nm. Consequently, by changing F while keeping the period length of the multilayer film constant, the peak-reflectivity wavelength of the multilayer-film surface changed relative to a fixed angle of incidence, thus giving the same result as changing the period length of the multilayer film. Meanwhile, as was seen in FIG. 7, whenever the incident wavelength (λ) is fixed, the angle of incidence at which reflectivity is maximal changes with corresponding changes in the period length of the multilayer film. Consequently, if Γ is changed while keeping the period length constant, the angle of incidence, at which reflectivity is maximal, changes relative to a fixed incident wavelength. By exploiting these results, even if the period length of the multilayer film is kept constant relative to a fixed incident wavelength, Γ can be selected so that the angles of incidence at various points on the mirror surface are respective angles at which reflectivity is maximal.

Figure 9:
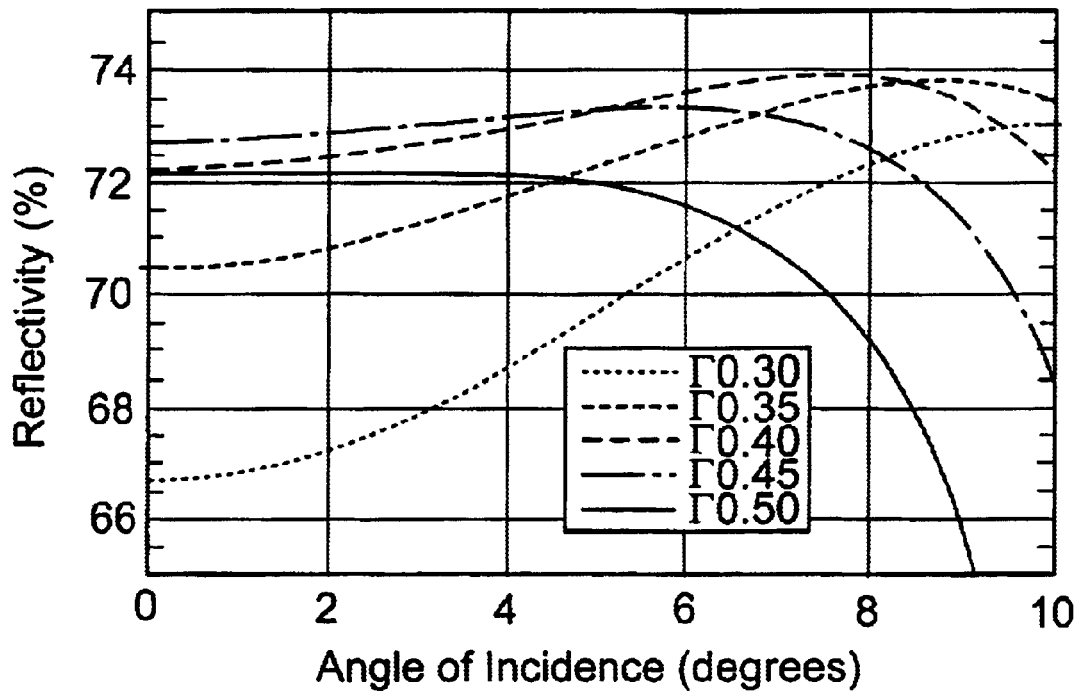
FIG. 9 is a series of plots of reflectivity versus angle of incidence at selected values of Γ.

FIG. 9 is a graph of reflectivity versus angle of incidence while changing Γ. The abscissa is angle of incidence and the ordinate is reflectivity. The graph is of data obtained when light of λ=13.36 nm was incident on a 50 layer-pair Mo/Si multilayer film having a period length of 69 Å. The various curves depict respective results of changing Γ.

It can be seen from FIG. 9 that the angle of incidence exhibiting maximal reflectivity changes according to Γ. In other words, the angle of incidence exhibiting maximal reflectivity is approximately 4° whenever Γ is 0.5, and is approximately 10° whenever Γ is 0.3. Hence, the smaller the value of Γ, the greater the difference, at which reflectivity is maximal, of the angle of incidence from 0°. Consequently, high reflectivity at various angles of incidence is obtained by selecting Γ at each angle of incidence so as to provide maximal reflectivity.

For example, Γ=0.45 exhibits the highest reflectivity at angles of incidence from 0° to 5°, while Γ=0.4 exhibits the highest reflectivity at angles of incidence from 5° to 8°, and Γ=0.35 exhibits the highest reflectivity at angles of incidence from 8° to 10°. To obtain the highest peak reflectivity over the surface of the multilayer-film mirror, it is desired that Γ appropriately range from 0.3 to 0.5 over the surface.

In FIG. 9, Γ was changed in increments of 0.05. It is especially desirable that Γ be changed in a continuous (non-stepped) manner to provide greater optimization of the reflectivity of the reflective surface. In order to select optimal values of Γ, θ and Γ desirably are correlated with each other by tracing the respective high-reflectivity envelope of each of the curves in FIG. 9. Thus, whenever the wavelength of the incident light is 13.6 nm and the period length is constant at 69 Å, reflectivity changes from approximately 72% to approximately 74% at angles of incidence ranging from 0° to 10°. This allows the maximum decrease in reflectivity to be limited to approximately 1%.

To change Γ while keeping the period length of the multilayer film constant, both the film-thickness distribution of the Mo layer and the film-thickness distribution of the Si layer are changed simultaneously. Thus, a desired thickness of the multilayer film is achieved while Γ is locally changed as required to provide a desired distribution over the surface so that maximal (or nearly maximal) reflectivity is obtained. This can be accomplished by controllably varying the distribution of sputtered atoms as sputtering is being performed. Controllably varying the distribution of sputtered atoms is achieved by changing one or more film-formation parameters such as the sputtering condition and/or the angle of inclination of the film-formation substrate (mirror) during sputtering. Alternatively, controllably changing Γ over the surface can be accomplished by using a film-formation-correction mask for controlling the concentration of sputtered atoms actually reaching specific regions on the surface of the mirror. In any event, a desired distribution of Γ over the mirror surface is achieved.

Figure 1A:
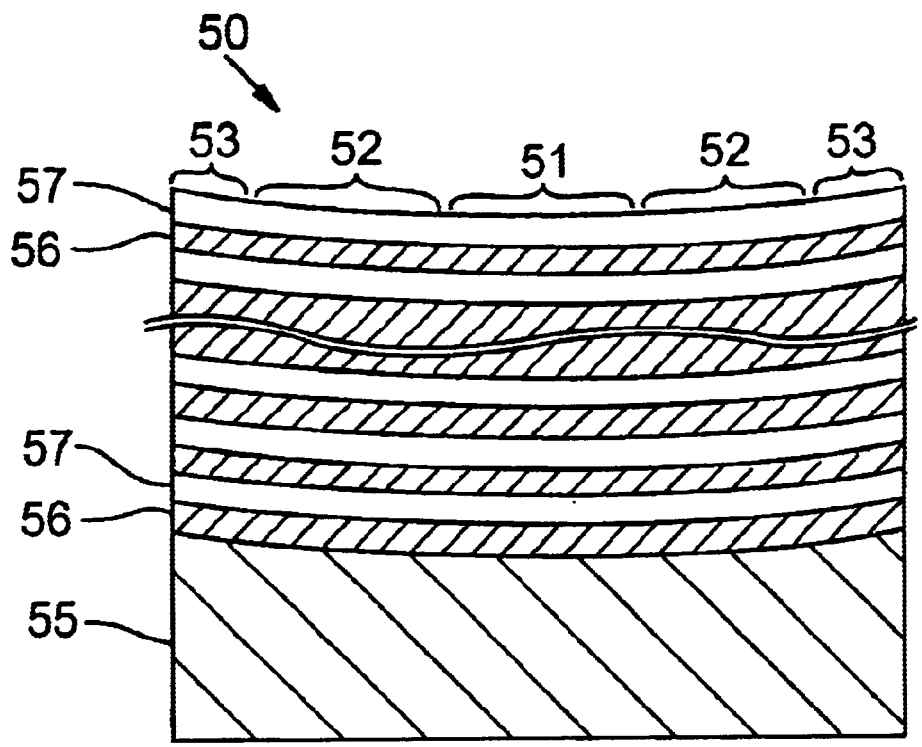
FIG. 1(A) is an elevational section schematically showing overall structure of a multilayer-film mirror according to a first representative embodiment.
Figure 1B:
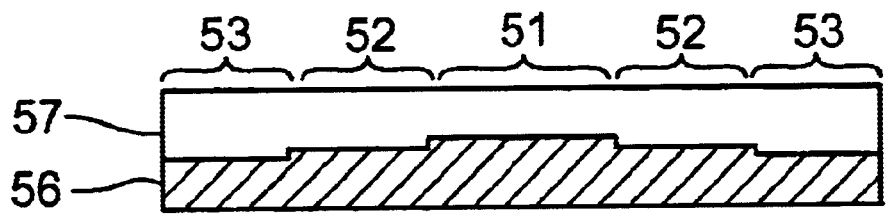
FIG. 1(B) is an elevational section schematically showing an exemplary layer pair of the mirror of FIG. 1(A).
Figure 2:
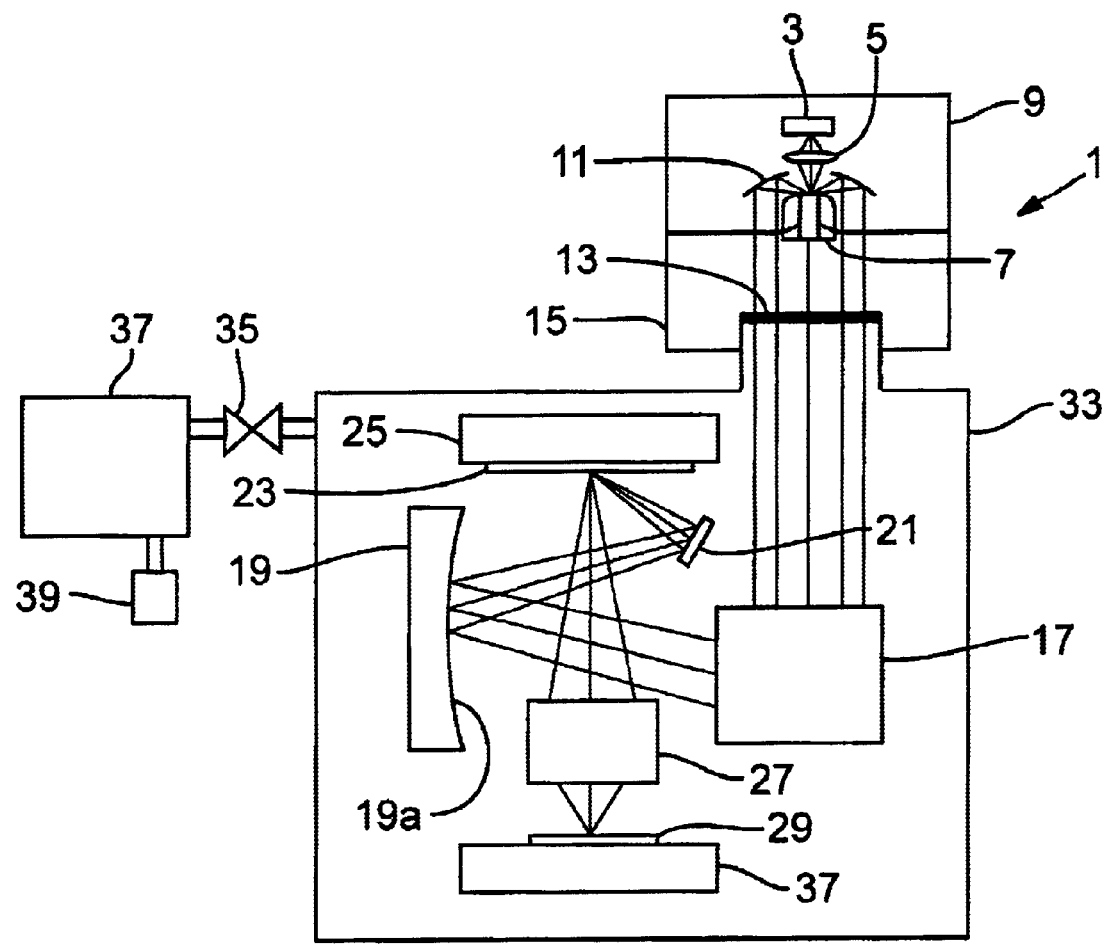
FIG. 2 is a schematic diagram of the overall structure of an embodiment of an X-ray lithography tool including a multilayer-film mirror such as that shown in FIG. 1(A).

FIGS. 1(A)–1(B) depict the structure of a multilayer-film mirror according to a first representative embodiment. FIG. 1(A) is an elevational section showing overall structure, and FIG. 1(B) is an elevational section showing an exemplary layer pair in the multilayer film. FIG. 2 is a schematic diagram of the overall structure of an X-ray lithography tool including the multilayer-film mirror of FIGS. 1(A)–1(B) and/or any of various other embodiments of the multilayer-film mirror.

Turning first to FIG. 2, the lithography tool 1 is a projection-exposure apparatus that performs a step-and-scan lithographic exposures using light in the soft X-ray band, having a wavelength of λ≈13 nm (EUV light), as the illumination light used for making lithographic exposures. A laser light source 3 is situated at the extreme upstream end of the tool 1. The laser light source 3 produces laser light having a wavelength in the range of infrared to visible. For example, the laser light source 3 can be a YAG or excimer laser employing semiconductor laser excitation. The laser light emitted from the laser light source 3 is focused and directed by a condensing optical system 5 to a laser-plasma light source 7. The laser-plasma light source 7 is configured to generate EUV radiation having a wavelength of λ≈13 nm.

A nozzle (not shown) is disposed in the laser-plasma light source 7, from which xenon gas is discharged. As the xenon gas is discharged from the nozzle in the laser-plasma light source 7, the gas is irradiated by the high-intensity laser light from the laser light source 3. The resulting intense irradiation of the xenon gas causes sufficient heating of the gas to generate a plasma. Subsequent return of Xe molecules to a low-energy state results in the emission of EUV light from the plasma. Since EUV light has low transmissivity in air, its propagation path must be enclosed in a vacuum environment produced in a vacuum chamber 9. Also, since debris tends to be produced in the environment of the nozzle from which the xenon gas is discharged, the chamber 9 desirably is separate from other chambers of the apparatus 1.

A paraboloid mirror 11, provided with a surficial multilayer Mo/Si coating, is disposed immediately upstream of the laser-plasma light source 7. EUV radiation emitted from the laser-plasma light source 7 enters the paraboloid mirror 11, and only EUV radiation having a wavelength of λ≈13 nm is reflected from the paraboloid mirror 11 as a coherent light flux in a downstream direction (downward in the figure). The EUV flux then encounters a pass filter 13 that blocks transmission of visible wavelengths of light and transmits the EUV wavelength. The pass filter 13 can be made, for example, of 0.15 nm-thick beryllium (Be). Hence, only EUV radiation having a wavelength of λ≈13 nm is transmitted through the pass filter 13. The area around the pass filter 13 is enclosed in a vacuum environment inside a chamber 15.

An exposure chamber 33 is situated downstream of the pass filter 13. The exposure chamber 33 contains an illumination-optical system 17 that comprises at least a condenser-type mirror and a fly-eye-type mirror. EUV radiation from the pass filter 13 is shaped by the illumination-optical system 17 into a circular flux that is directed to the left in the figure toward an X-ray-reflective mirror 19. The mirror 19 has a circular, concave reflective surface 19a, and is held in a vertical orientation (in the figure) by holding members (not shown). The mirror 19 comprises a substrate made, e.g., of quartz or low-thermal-expansion material such as Zerodur (Schott). The reflective surface 19a is shaped with extremely high accuracy and coated with a Mo/Si multilayer film that is highly reflective to 13 nm-wavelength X-rays. Whenever X-rays having wavelengths of 10 to 15 nm are used, the multilayer film on the surface 19a can include a material such as ruthenium (Ru) or rhodium (Rh). Other candidate materials are silicon, beryllium (Be), and carbon tetraboride ($B_4C$).

A bending mirror 21 is disposed at an angle relative to the mirror 19 to the right of the mirror 19 in the figure. A reflective reticle or mask 23, that defines a pattern to be transferred lithographically to a sensitive substrate 29, is situated "above" the bending mirror 21. Note that the mask 23 is oriented horizontally with the reflective surface directed downward to avoid deposition of any debris on the surface of the mask 23. X-rays emitted from the illumination-optical system 17 are reflected and focused by the X-ray reflective mirror 19, and reach the reflective surface of the mask 23 via the bending mirror 21.

The mask 23 has an X-ray-reflective surface configured as a multilayer film. Pattern elements, corresponding to pattern elements to be transferred to the sensitive substrate ("wafer") 29, are defined on or in the X-ray-reflective surface. The reflective mask 23 is mounted on a mask stage 25 that is movable in at least the Y-direction in the figure. Hence, X-rays reflected by the bending mirror 21 are incident at a desired location on the X-ray-reflective surface of the mask 23.

A projection-optical system 27 and the wafer 29 are disposed downstream of the reflective mask 23. The projection-optical system 27 comprises several X-ray-reflective mirrors. An X-ray beam from the reflective mask 23, carrying an aerial image of the illuminated portion of the mask 23, is "reduced" (demagnified) by a desired factor (e.g., ¼) by the projection-optical system and focused on the surface of the wafer 29, thereby forming an image of the illuminated portion of the pattern on the wafer 29. The wafer 29 is mounted by suction or other appropriate mounting force to a wafer stage 31 that is movable in the X-direction, Y-direction, and Z-direction.

A pre-exhaust chamber 37 (load-lock chamber) is connected to the exposure chamber 33 by a gate valve 35. A vacuum pump 39 is connected to the pre-exhaust chamber 37 and serves to form a vacuum environment inside the pre-exhaust chamber 37.

During a lithographic exposure performed using the apparatus shown in FIG. 2, EUV light is directed by the illumination-optical system 17 onto a selected region of the reflective surface of the mask 23. As exposure progresses, the mask 23 and wafer 29 are scanned synchronously (by their respective stages 25, 31) relative to the projection-optical system 27 at a specified velocity ratio determined by the demagnification ratio of the projection-optical system. Normally, because not all the pattern defined by the reticle can be transferred in one "shot," successive portions of the pattern, as defined on the mask 23, are transferred to corresponding shot fields on the wafer 29 in a step-and-scan manner. By way of example, a 25 mm×25 mm square chip can be exposed on the wafer 29 with a 0.07 $\mu$m line spacing IC pattern at the resist on the wafer 29.

Turning now to FIGS. 1(A)–1(B), the depicted mirror 50 can be used, for example, as the X-ray-reflective mirror 19 and/or the X-ray-reflective mirror 11 in the lithography tool 1 shown in FIG. 2. The multilayer-film mirror 50 comprises a substrate 55 defining a concave surface on which is formed a multilayer film comprising 50 layer-pairs of Mo and Si having a 69 Å period length. Each period comprises one respective layer of Mo 56 and one respective layer of Si 57 comprising a respective "layer pair." The angles of incidence of light impinging on the multilayer-film mirror 50 are 0° to 5° in the central region 51 in the figure, 5° to 8° in the intermediate regions 52, and 8° to 10° in the outer regions 53.

In one layer pair of this multilayer film, the respective thicknesses of the Mo layer 56 and the Si layer 57 are established so that $\Gamma$=0.45 in the region 51, $\Gamma$=0.40 in the region 52, and $\Gamma$=0.35 in the region 53. Thus, in the depicted layer pair, $\Gamma$ exhibits a "stepped" distribution over the reflective surface of the mirror. The values for $\Gamma$ are obtained from FIG. 9, discussed above. This multilayer film is produced by ion-beam sputtering, using individual sputtered-atom correction plates for Mo and for Si when forming each respective layer. By configuring the multilayer film in this manner, decreases in reflectivity of the multilayer-film surface can be limited to about 1% for angles of incidence in the range from 0° to 10°.

Figure 3:
FIG. 3 is an elevational section schematically depicting a single layer pair in a multilayer-film mirror according to a second representative embodiment.

FIG. 3 is an elevational section of a single layer pair in a multilayer-film mirror according to a second representative embodiment. The multilayer film in this embodiment has a structure in which the angles of incidence of light impinging on the mirror are distributed continuously from 0° to 10° from the center of the mirror toward the perimeter of the mirror. The respective thicknesses of the Mo layer 56 and the Si layer 57 in the depicted layer pair are established such that $\Gamma$ is distributed continuously from 0.45 to 0.35 from the center of the mirror toward the perimeter of the mirror. $\Gamma$ at each point on the substrate is selected so that reflectivity is maximized at the angle of incidence at that point. This multilayer film is produced by ion-beam sputtering, using individual sputtered-atom correction plates for Mo and for Si when forming each respective layer. By forming the multilayer film in this manner, decreases in reflectivity are limited to about 1% for angles of incidence ranging from 0° to 10°.

Figure 4A:
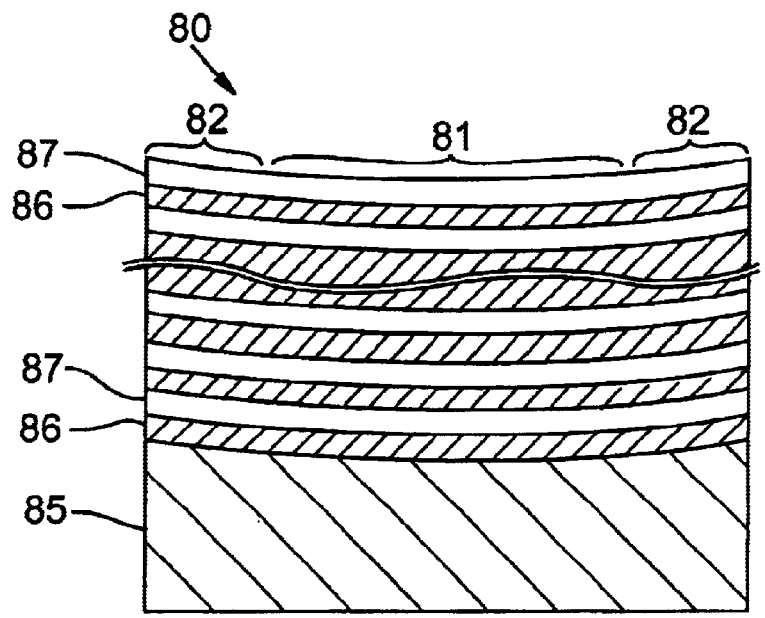
FIG. 4(A) is an elevational section schematically showing overall structure of a multilayer-film mirror according to a third representative embodiment.
Figure 4B:
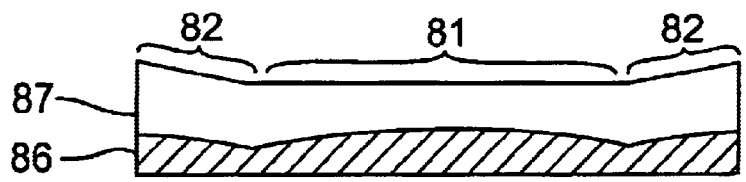
FIG. 4(B) is an elevational section schematically showing an exemplary layer pair of the mirror of FIG. 4(A).

A third representative embodiment of a multilayer-film mirror 80 is shown in FIGS. 4(A)–4(B), wherein FIG. 4(A) is an elevational section schematically showing the overall structure, and FIG. 4(B) is an elevational section schematically depicting an exemplary layer pair of the multilayer film. The multilayer-film mirror 80 has a structure similar to the multilayer-film mirror in FIGS. 1(A)–1(B), wherein Mo layers 86 and Si layers 87 are alternately laminated on the curved surface of a substrate 85. The angles of incidence of light impinging on this multilayer-film mirror 80 vary from 0° to 20° from the center of the substrate 85 to the perimeter of the substrate, respectively. I.e., the angles of incidence in the region 81 range from 0° to 10°, and the angles of incidence in the region 82 are 10° and greater.

In a single layer pair of this multilayer film, the respective thicknesses of the Mo layer 86 and the Si layer 87 are established such that r varies continuously from 0.45 to 0.35 from the center toward the edge of the region 81 in which the angles of incidence range from 0° to 10°, as in the embodiment of FIG. 3. If $\Gamma$ were to continue to diminish in the region 82 (from the edge contacting the region 81 to the edge of the mirror) in which the angle of incidence is 10° and greater, then the reflectivity would decrease as $\Gamma$ drops below 0.35. To prevent such a decrease in reflectivity, a conventional compensation scheme (in which the thickness of the multilayer film is changed) is utilized in the region 82. In other words, while maintaining $\Gamma$=0.35 in the region 82, the period length is increased.

Thus, according to this embodiment, and with respect to mirrors in which a certain area has a broad range of angles of incidence that cannot be compensated for only by varying the distribution of $\Gamma$, a conventional scheme of changing the thickness of the multilayer film (i.e., changing the period length) can be applied locally. Thus, the magnitude of change in distribution of film thickness is smaller than when variations of the film-thickness distribution were performed in the conventional manner over the entire surface of the mirror. As a result, deterioration of the optical performance of the mirror is reduced compared to conventional methods.

In this embodiment the multilayer film was produced by ion-beam sputtering using individual sputter-correction plates for Mo and for Si when forming each respective layer. Alternatively, the distribution of $\Gamma$ and the distribution of the multilayer-film thickness for a given region could be achieved using a single sputter-correction plate.

Figure 5:
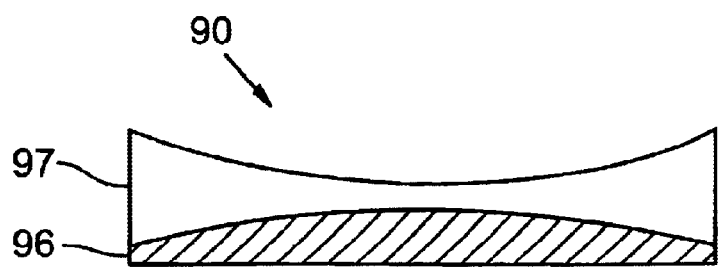
FIG. 5 is an elevational section schematically depicting a single layer pair in a multilayer-film mirror according to a fourth representative embodiment.
Figure 6:
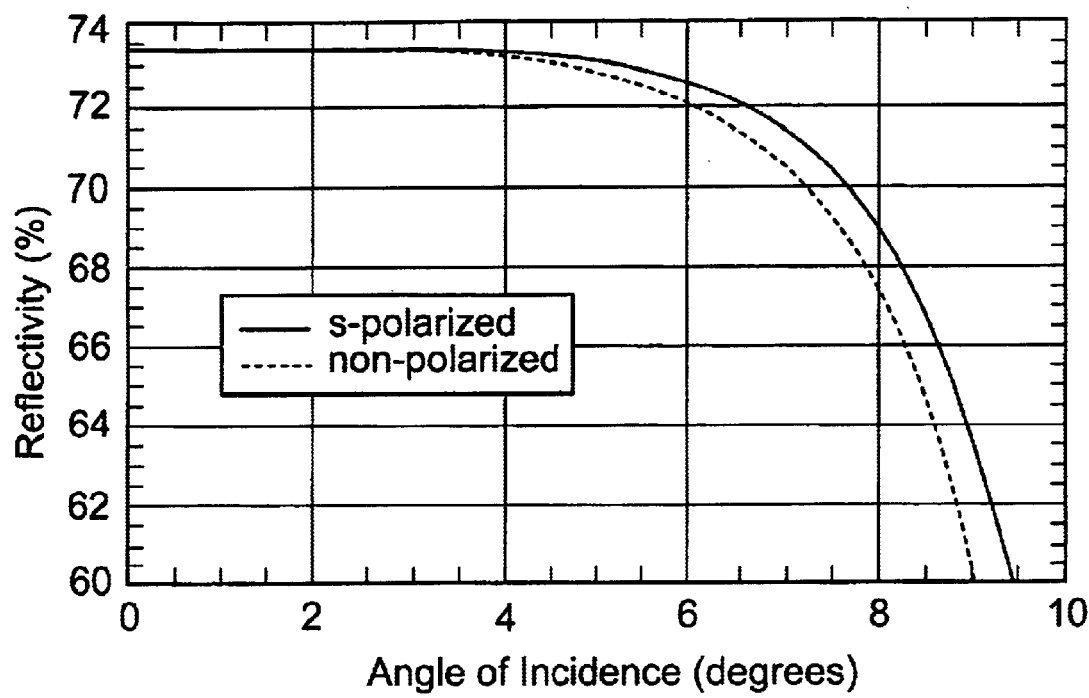
FIG. 6 is a graph showing a theoretical relationship of reflectivity to angle of incidence in a multilayer-film mirror having a period length of 69 Å, a lamina count of 50 layer pairs, and an incident-light wavelength of 13.36 nm.

A fourth representative embodiment of a multilayer-film mirror 90 is shown in FIG. 5, providing an elevational section of an exemplary layer pair of the mirror. The multilayer-film mirror 90 has a structure similar to the multilayer-film mirror in FIGS. 1(A)–1(B), wherein Mo layers 96 and Si layers 97 are alternately laminated onto the surface of a substrate 95. In this embodiment, while continuously changing $\Gamma$ from the center of the mirror toward the perimeter in a single layer pair, the period length also is changed continuously. In this case, the reflectivity is slightly lower than in situations in which corrections of the distribution of film thickness are performed by changing only the period length over the entire surface. However, in this embodiment, deterioration of optical performance of the mirror can be suppressed well for many uses. This embodiment is more desirable, from a practical standpoint, than the embodiment of FIGS. 4(A)–(B).

Selecting maximal reflectivity by changing $\Gamma$, while maintaining constancy of the period length, as described above, is especially suitable for angles of incidence ranging from 0° to 10°. At angles of incidence greater than 10°, the multilayer film can be formed with $\Gamma$ being relatively high (e.g., 0.4 to 0.45 at angles of incidence near 0°). The coating can be formed with $\Gamma$ being lower (e.g., 0.3 to 0.35) at locations more off-axis by changing the period length.

As is clear from the foregoing, multilayer-film mirrors are provided that exhibit high reflectivity without having to change the period length of the multilayer film. Also, X-ray exposure apparatus are provide that include such multilayer-film mirrors, in which apparatus the multilayer-film mirrors exhibit high reflectivity without significant deterioration of optical performance.

Whereas the invention has been described in connection with multiple representative embodiments, the invention is not limited to those embodiments. On the contrary, the invention is intended to encompass all modifications, alternatives, and equivalents as may be included within the spirit and scope of the invention, as defined by the appended claims.

What is claimed is:

1. A multilayer-film mirror, comprising:
    a mirror substrate; and
    a multilayer film on a surface of the mirror substrate, the multilayer film being configured so as to render the surface reflective to one or more selected wavelengths of incident X-ray light, the multilayer film being formed of alternating superposed layers of a first and a second material arranged as multiple layer pairs superposed on the surface, the first material having a relatively large difference between its refractive index for X-ray light and its refractive index in a vacuum, and the second material having a relatively small difference between its refractive index for X-ray light and its refractive index in a vacuum, wherein (a) each layer of the first material in the multilayer film has a respective thickness, and (b) in at least one of the layer pairs, a ratio ($\Gamma$) of the thickness of the respective layer of the first material to a thickness of the layer pair has a variable distribution over at least a portion of the surface.

2. The multilayer-film mirror of claim 1, wherein $\Gamma$ varies with changes in angle of incidence of incident radiation over at least a portion of the surface.

3. The multilayer-film mirror of claim 1, wherein $\Gamma$ decreases with corresponding increases in angle of incidence of incident radiation over at least a portion of the surface.

4. The multilayer-film mirror of claim 1, wherein the first material comprises molybdenum.

5. The multilayer-film mirror of claim 4, wherein the second material comprises silicon.

6. The multilayer-film mirror of claim 4, wherein the first material comprises molybdenum and ruthenium.

7. The multilayer-film mirror of claim 6, wherein the molybdenum and ruthenium are formed as respective layers laminated together to form at least one layer of the first material.

8. The multilayer-film mirror of claim 1, wherein the second material comprises silicon.

9. The multilayer-film mirror of claim 1, wherein:
    the distribution of $\Gamma$ is stepped over at least a portion of the surface; and
    each step corresponds to a respective range of angle of incidence of radiation incident to the surface.

10. The multilayer-film mirror of claim 1, wherein:
    the distribution of $\Gamma$ is continuous over at least a portion of the surface; and
    in the distribution, $\Gamma$ varies with respective angles of incidence of radiation incident to the surface.

11. The multilayer-film mirror of claim 10, wherein:
    the layer pairs have a period length;
    the distribution of $\Gamma$ is continuous over a first portion of the surface in which angle of incidence of light incident to the surface is within a respective range and the period length is constant; and
    in a second portion of the surface outside the first portion, $\Gamma$ is constant while the period length is increased.

12. The multilayer-film mirror of claim 10, wherein:
    the layer pairs have a period length;
    the distribution of $\Gamma$ is continuous over the surface; and
    the period length changes continuously over the surface.

13. An optical system, comprising the multilayer-film mirror of claim 1.

14. The optical system of claim 13, configured as an X-ray optical system.

15. The optical system of claim 14, configured as an EUV optical system.

16. An optical element reflective to incident X-ray light, comprising:
    a mirror substrate; and
    a multilayer film on a surface of the mirror substrate, the multilayer film being configured so as to render the surface reflective to one or more selected wavelengths of incident X-ray light, the multilayer film being formed of alternating superposed layers of a first and a second material arranged as multiple layer pairs superposed on the surface, the first material having a relatively large difference between its refractive index for X-ray light and its refractive index in a vacuum, and the second material having a relatively small difference between its refractive index for X-ray light and its refractive index in a vacuum, wherein (a) each layer of the first material in the multilayer film has a respective thickness, and (b) in at least one of the layer pairs, a ratio ($\Gamma$) of the thickness of the respective layer of the first material to a thickness of the layer pair has a variable distribution over at least a portion of the surface.

17. The optical element of claim 16, configured as a multilayer-film mirror.

18. The optical element of claim 16, configured as a reflective reticle.

19. An X-ray optical system, comprising an optical element as recited in claim 16.

20. An X-ray lithography tool, comprising an X-ray optical system as recited in claim 19.

21. A method for producing a multilayer-film mirror, comprising:

configuring a surface of a mirror substrate to be a reflective surface;

on the reflective surface, forming a multilayer-film coating by applying alternating superposed layers of a first and a second material arranged as multiple layer pairs superposed on the reflective surface, the first material having a relatively large difference between its refractive index for X-ray light and its refractive index in a vacuum, and the second material having a relatively small difference between its refractive index for X-ray light and its refractive index in a vacuum, wherein (a) each layer of the first material in the multilayer film has a respective thickness, and (b) in at least one of the layer pairs, a ratio ($\Gamma$) of the thickness of the respective layer of the first material to a thickness of the layer pair has a variable distribution over at least a portion of the surface.

22. The method of claim 21, wherein the multilayer-film coating is formed such that $\Gamma$ varies with changes in angle of incidence of incident radiation over at least a portion of the surface.

23. The method of claim 21, wherein the multilayer-film coating is formed such that $\Gamma$ decreases with corresponding increases in angle of incidence of incident radiation over at least a portion of the surface.

24. The method of claim 21, wherein the multilayer-film coating is formed such that the distribution of $\Gamma$ is stepped over at least a portion of the surface, each step corresponding to a respective range of angle of incidence of radiation incident to the surface.

25. The method of claim 21, wherein the multilayer-film coating is formed such that the distribution of $\Gamma$ is continuous over at least a portion of the surface, and, in the distribution, F varies with respective angles of incidence of radiation incident to the surface.

26. The method of claim 25, wherein the multilayer-film coating is formed such that the layer pairs have a period length, the distribution of $\Gamma$ is continuous over a first portion of the surface in which angle of incidence of light incident to the surface is within a respective range and the period length is constant, and, in a second portion of the surface outside the first portion, $\Gamma$ is constant while the period length is increased.

27. The method of claim 25, wherein the multilayer-film coating is formed such that the layer pairs have a period length, the distribution of $\Gamma$ is continuous over the surface, and the period length changes continuously over the surface.

28. An X-ray lithography tool, comprising:

an X-ray light source situated and configured to produce an X-ray illumination beam;

an illumination-optical system situated downstream of the X-ray light source and configured to guide the illumination beam to a reticle, so as to form a patterned beam of X-ray light reflected from the reticle; and a projection-optical system situated downstream of the reticle and configured to guide the patterned beam from the reticle to a sensitive substrate;

wherein at least one of the illumination-optical system, the reticle, and the projection-optical system comprises a multilayer-film mirror, comprising a multilayer film on a surface of a mirror substrate, the multilayer film being configured so as to render the surface reflective to one or more selected wavelengths of incident X-ray light, the multilayer film being formed of alternating superposed layers of a first and a second material arranged as multiple layer pairs superposed on the surface, the first material having a relatively large difference between its refractive index for X-ray light and its refractive index in a vacuum, and the second material having a relatively small difference between its refractive index for X-ray light and its refractive index in a vacuum, wherein (a) each layer of the first material in the multilayer film has a respective thickness, and (b) in at least one of the layer pairs, a ratio ($\Gamma$) of the thickness of the respective layer of the first material to a thickness of the layer pair has a variable distribution over at least a portion of the surface.

29. The lithography tool of claim 28, wherein:

the first material has a relatively large difference between its refractive index for EUV light and its refractive index in a vacuum;

the second material has a relatively small difference between its refractive index for EUV light and its refractive index in a vacuum; and the illumination beam is an EUV beam.

* * * * *

UNITED STATES PATENT AND TRADEMARK OFFICE
CERTIFICATE OF CORRECTION

PATENT NO. : 6,833,223 B2
DATED : December 21, 2004
INVENTOR(S) : Masayuki Shiraishi It is certified that error appears in the above-identified patent and that said Letters Patent is hereby corrected as shown below:

Column 2,
Line 24, "2d sin(θ') = nλ" should be -- 2dsin(θ') = nλ --.

Column 3,
Line 8, "110° angle" should be -- 10° angle --.

Column 4,
Line 18, "F at" should be -- Γ at --.

Column 6,
Line 39, "minor is" should be -- mirror is --.
Line 59, "F while" should be -- Γ while --.

Column 10,
Line 45, "r varies" should be -- Γ varies --.

Column 13,
Line 44, "F varies" should be -- Γ varies --.

Signed and Sealed this

Twenty-fourth Day of May, 2005

JON W. DUDAS
*Director of the United States Patent and Trademark Office*